United States Patent
Qi

(10) Patent No.: US 10,249,707 B2
(45) Date of Patent: *Apr. 2, 2019

(54) LATERALLY DIFFUSED METAL OXIDE SEMICONDUCTOR FIELD-EFFECT TRANSISTOR AND MANUFACTURING METHOD THEREFOR

(71) Applicant: CSMC TECHNOLOGIES FAB2 CO., LTD., Wuxi New District, Jiangsu (CN)

(72) Inventor: Shukun Qi, Jiangsu (CN)

(73) Assignee: CSMC TECHNOLOGIES FAB2 CO., LTD., Wuxi New District, Jiangsu (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/564,727

(22) PCT Filed: Jan. 29, 2016

(86) PCT No.: PCT/CN2016/072839
§ 371 (c)(1),
(2) Date: Oct. 5, 2017

(87) PCT Pub. No.: WO2016/161840
PCT Pub. Date: Oct. 13, 2016

(65) Prior Publication Data
US 2018/0114831 A1 Apr. 26, 2018

(30) Foreign Application Priority Data
Apr. 8, 2015 (CN) .......................... 2015 1 0163925

(51) Int. Cl.
*H01L 29/06* (2006.01)
*H01L 29/78* (2006.01)
(Continued)

(52) U.S. Cl.
CPC ...... *H01L 29/0634* (2013.01); *H01L 29/1079* (2013.01); *H01L 29/1095* (2013.01);
(Continued)

(58) Field of Classification Search
CPC ............. H01L 29/0634; H01L 29/7816; H01L 29/66568; H01L 29/66681; H01L 29/1079;
(Continued)

(56) References Cited

U.S. PATENT DOCUMENTS 7,696,564 B1 * 4/2010 Liao ...................... H01L 29/086
257/327
8,866,252 B2 * 10/2014 Trajkovic ............ H01L 29/7816
257/492
(Continued)

FOREIGN PATENT DOCUMENTS

CN 1377087 10/2002
CN 1527401 9/2004
(Continued)

OTHER PUBLICATIONS

International Search Report for international application No. PCT/CN2016/072839, dated Apr. 19, 2016 (4 pages, including English translation).

*Primary Examiner* — Alexander O Williams
(74) *Attorney, Agent, or Firm* — Hamre, Schumann, Mueller & Larson, P.C.

(57) ABSTRACT

A laterally diffused metal oxide semiconductor field-effect transistor, comprising a substrate (110), a source electrode (150), a drain electrode (140), a body region (160), and a well region on the substrate, the well region comprising: an insertion-type well (122) having P-type doping, being arranged below the drain electrode and being connected to the drain electrode; N wells (124), arranged on two sides of
(Continued)

the insertion-type well; and P wells (126), arranged next to the N wells and being connected to the N wells; the source electrode and the body region are arranged in the P well.

13 Claims, 4 Drawing Sheets

(51) Int. Cl.
*H01L 29/10* (2006.01)
*H01L 29/66* (2006.01)
(52) U.S. Cl.
CPC .. *H01L 29/66568* (2013.01); *H01L 29/66659* (2013.01); *H01L 29/66681* (2013.01); *H01L 29/7816* (2013.01); *H01L 29/7835* (2013.01); *H01L 29/0623* (2013.01)
(58) Field of Classification Search
CPC ..... H01L 29/1095; H01L 29/06; H01L 29/78; H01L 29/10; H01L 29/66; H01L 29/063
USPC ....... 257/328, 327, 335, 357, 336, 343, 344; 385/147

See application file for complete search history.

(56) References Cited

U.S. PATENT DOCUMENTS

| 2016/0240660 A1* | 8/2016 | Yue | H01L 29/7816 |
| 2018/0069107 A1* | 3/2018 | Qi | H01L 29/7394 |
| 2018/0122921 A1* | 5/2018 | Qi | H01L 29/66681 |

FOREIGN PATENT DOCUMENTS

| CN | 101931004 | | 12/2010 | | |
| JP | 2007266326 A | | 10/2007 | | |
| JP | 2008066508 A | | 3/2008 | | |
| WO | 2016161840 A1 | * | 10/2016 | ............. | H01L 29/06 |
| WO | 2016161841 A1 | * | 10/2016 | ............. | H01L 29/78 |
| WO | 2017059739 A1 | * | 4/2017 | ............. | H01L 29/78 |
| WO | 2017092419 A1 | * | 6/2017 | ............. | H01L 29/78 |
| WO | 2017219968 A1 | * | 12/2017 | ............ | H01L 29/739 |

* cited by examiner

LATERALLY DIFFUSED METAL OXIDE SEMICONDUCTOR FIELD-EFFECT TRANSISTOR AND MANUFACTURING METHOD THEREFOR

FIELD OF THE INVENTION

The present disclosure relates to semiconductor processes, and more particularly relates to a laterally diffused metal oxide semiconductor field-effect transistor, and a manufacturing method of the laterally diffused metal oxide semiconductor field-effect transistor.

BACKGROUND OF THE INVENTION

A basic structure using reduced surface field (RESURF) principle consists of a low-doped P-type substrate and a low-doped N-type epitaxial layer. A P well is formed on the epitaxial layer and N+, P+are implanted into the P well, such that a transverse P-well/N-epi (P well/N-type epitaxial layer) junction and a longitudinal P-sub/N-epi (P-type substrate/N-type epitaxial layer) junction are formed. Due to a higher doping concentration at both ends of the transverse junction, the breakdown voltage of the transverse junction is lower than that of the longitudinal junction. The basic principle of RESURF is to enable the epitaxial layer to be completely depleted before the transverse junction reaches the critical avalanche breakdown field by using the interaction of the transverse junction and the longitudinal junction. By reasonably optimizing the device parameters, the breakdown of the device occurs in the longitudinal junction, thereby playing a role in reducing the surface field.

In the conventional RESURF structure, a low-doped deep well is easily to be depleted, thus the breakdown is prone to occur on a surface of a drain region, and the on-resistance is high, thereby affecting the reliability and product application.

SUMMARY OF THE INVENTION

Accordingly, in view of the problem of being high on-resistance and easy to breakdown in the conventional RESURF structure mentioned in the background art, it is necessary to provide a laterally diffused metal oxide semiconductor field-effect transistor with a low on-resistance and improved breakdown characteristics.

A laterally diffused metal oxide semiconductor field-effect transistor includes a substrate, a source, a drain, a body region, and a well region on the substrate. The well region includes: an inserting type well having a P-doping type, wherein the inserting type well is disposed below the drain and is in contact with the drain; an N well disposed on both sides of the inserting type well; and a P well disposed adjacent to the N well and in contact with the N well; wherein the source and the body region are disposed in the P well.

A method of manufacturing a laterally diffused metal oxide semiconductor field-effect transistor includes the steps of: providing a substrate; forming an N well implantation window on the substrate by lithography, and implanting N-type ions into the substrate through the N well implantation window; wherein the N well implantation window is separated by a photoresist covered on the substrate to preserve a position for an inserting type well; performing a thermal drive-in to form an N well; implanting P-type ions into the substrate and performing the thermal drive-in, thus forming the inserting type well inserted into the N well, and a P well formed adjacent to the N well and in contact with the N well; forming an active region and a field oxide; and forming a source and a drain; wherein the drain is formed above the inserting type well, and is in contact with the inserting type well.

Another method of manufacturing a laterally diffused metal oxide semiconductor field-effect transistor includes the steps of: providing a substrate; forming a first N well implantation window on the substrate by lithography, and implanting N-type ions into the substrate through the first N well implantation window; wherein the first N well implantation window is separated by a photoresist covered on the substrate to preserve a position for a first inserting type well; performing a thermal drive-in to form a first N well; implanting P-type ions into the substrate and performing the thermal drive-in, thus forming the first inserting type well inserted into the first N well, and a first P well formed adjacent to the first N well and in contact with the first N well; forming a first epitaxial layer on the substrate; performing lithography and implanting N-type ions into the first epitaxial layer, thus forming a second N well in contact with the first N well above the first N well after performing the thermal drive-in; implanting P-type ions into the second N well and performing the thermal drive-in, thus forming a second inserting type well inserted into the second N well, and a second P well formed adjacent to the second N well; wherein the second inserting type well is formed above the first inserting type well and is in contact with the first inserting type well, the second P well is formed above the first P well and is in contact with the first P well; forming an active region and a field oxide; and forming a source and a drain; wherein the drain is formed above the second inserting type well, and is in contact with the second inserting type well.

The aforementioned laterally diffused metal oxide semiconductor field-effect transistor forms a triple RESURF structure by an inserting type well, which helps to increase the doping concentration of the N well and reduce the on-resistance of the device, and helps to improve the breakdown characteristics of the device.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Embodiments of the invention are described more fully hereinafter with reference to the accompanying drawings.

The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The term "and/or" as used herein includes any and all combinations of one or more of the associated listed items.

The present disclosure provides a laterally diffused metal oxide semiconductor field-effect transistor having a reduced surface field (RESURF) structure, which includes a substrate, a source, a drain, a body region, and a well region on the substrate. The well region specifically includes an N well, a P well, and an inserting type well inserted into the N well. The inserting type well has a doping type of P-type, which is disposed below the drain and is in contact with the drain and the substrate. The N well is disposed on both sides of the inserting type well. The P well is disposed adjacent to the N well and is in contact with the N well. The source and the body region are disposed in the P well.

Figure 1:
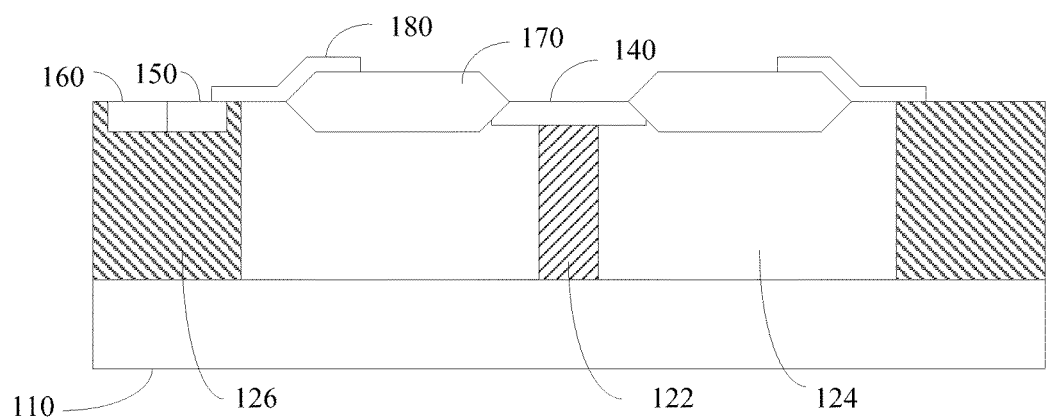
FIG. 1 is a schematic view of a laterally diffused metal oxide semiconductor field-effect transistor according to an embodiment.

FIG. 1 is a schematic view of a laterally diffused metal oxide semiconductor field-effect transistor (LDMOS) having a RESURF structure according to an embodiment, which is a left-right symmetric structure. The LDMOS includes a substrate 110, a well region on the substrate, a drain 140, a source 150, a body region 160, a field oxide region 170, and a polysilicon structure 180. The substrate is P-type doped, the drain 140 is N-type doped, the source 150 is N-type doped, and the body region 160 is P-type doped. The well region includes a P-type doped inserting type well 122, an N well 124 serving as a drift region, and a P well 126 serving as a channel region. The field oxide region 170 is disposed on a surface of the N well 124 of the drift region, and the drain 140 is sandwiched by the two field oxide regions 170. The polysilicon structure 180 is composed of a polysilicon gate and a field portion, which is extended from a surface of the field oxide region 170 to a surface of the source 150.

Referring to FIG. 1, the P well 126 is inserted into the N well 124 by splitting the N well 124 to a certain width below a drain terminal N+junction of the existing structure, so as to form a triple RESURF structure, such that the inserting type well 122, the N well 124, the P well 126, and the substrate 110 are depleted from each other, and the breakdown point is transferred to the device body, thus the device can be longitudinally breakdown.

In one embodiment, a width of the inserting type well 122 is 10% to 40% of a width of the active region of the drain.

The width of the inserting type well 122 cannot be too wide, and it is necessary to ensure that the N-well 124 at both sides below the drain 140 are still in contact with the drain 140 (i.e., the width of the inserting type well 122 is at least less than that of the drain 140), such that a concentration of the N well 124 of the drift region can be improved compared with the prior art, which helps to the reduction of the on-resistance. This is because when an additional charge is added to the depletion region, the charge density of the opposite type will be increased correspondingly so as to meet the requirements of the charge balance.

The inserting type well 122 cannot be too narrow. The inserting type well 122 of a certain width can effectively control the order of the occurrence of the breakdown in the device body. If the width is too narrow, the inserting type well 122 has less influence on the depletion region of the N well 124 at both sides, and the breakdown position is close to the breakdown position when the N well 124 of the drift region is not provided with the inserting type well 122 in the prior art, such that the insertion of the inserting type well 122 is less effective for the adjustment of the breakdown.

When the drain 140 is externally coupled to a higher potential and depleted to the drain 140, the inserting type well 122 is depleted with the N well 124 of the drift region at both sides, until a depletion layer formed on the N-well 124 at both sides is gradually expanded to be overlapped in the P well 126. The potential lines on both sides are coupled to each other, and then depleted to the substrate 110 from top to bottom, such that the electric field peak is weakened, thereby effectively improving the breakdown voltage.

In the illustrated embodiment shown in FIG. 1, the drain 140 is an N+ drain, the source 150 is an N+ source, and the body region 160 is a P+ region.

Figure 2:
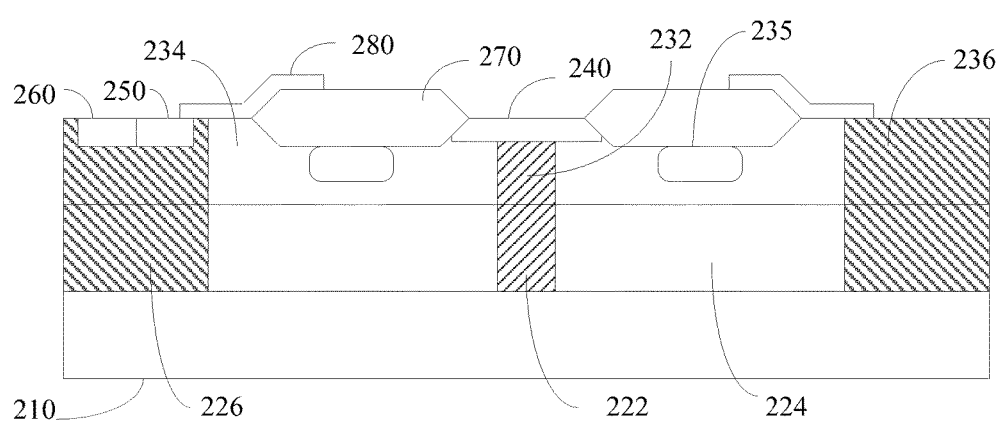
FIG. 2 is a schematic view of a laterally diffused metal-oxide-semiconductor field-effect transistor according to another embodiment.

FIG. 2 is a schematic view of a laterally diffused metal-oxide-semiconductor field-effect transistor having a RESURF structure according to another embodiment. The difference compared to the embodiment shown in FIG. 1 lies in that, the well region is composed of a high voltage well configured to cooperate with a high voltage device and a low voltage well configured to cooperate with a low voltage device. In other words, LDMOS includes a substrate 210, a first well region on the substrate and a second well region on the first well region, a drain 240, a source 250, a body region 260, a filed oxide region 270, and a polysilicon structure 280. The first well region includes a P-type doped first inserting type well 222, a first N well 224, and a first P well 226. The second well region includes a second inserting type well 232, a second N well 234, and a third P well 236. The second inserting type well 232, the second N well 234, and the third P well 236 are in contact with the first inserting type well 222, the first N well 224, and the first P well 226, respectively. The first N well 224 and the second N well 234 cooperatively serve as a drift region. The drain 250 and the body region 260 are disposed in the second P well 236.

In the embodiment shown in FIG. 2, the LDMOS further includes a floating layer P well 235 disposed in the second N well 234 and below the field oxide region 270. A doping concentration of the floating layer P well 235 is lower than that of the second N well 234, which can slow down the concentration gradient and improve the device withstand voltage.

In order to ensure that there is still a higher concentration of N-type impurities when the drift region is depleted to the active region (DTO) of the drain 240, it is necessary to ensure that an N+ between the N well (including the first N well 224 and the second N well 234) and the inserting type well (including the first inserting type well 222 and the second inserting type well 232) still has a certain effective width, at least 30% of the active region of the drain 240. Thus, widths of the first inserting type well 222 and the second inserting type well 232 should be less than or equal to 40% of a width of the active region of the drain 240. In an embodiment where the active region has a width of 10 µm, the aforementioned effective width is at least 3 µm, i.e., widths of the first inserting type well 222 and the second inserting type well 232 are less than or equal to 2 µm.

In the illustrated embodiment shown in FIG. 2, the drain 240 is an N+ drain, the source 250 is an N+ source, and the body region 260 is a P+ region.

Figure 3:
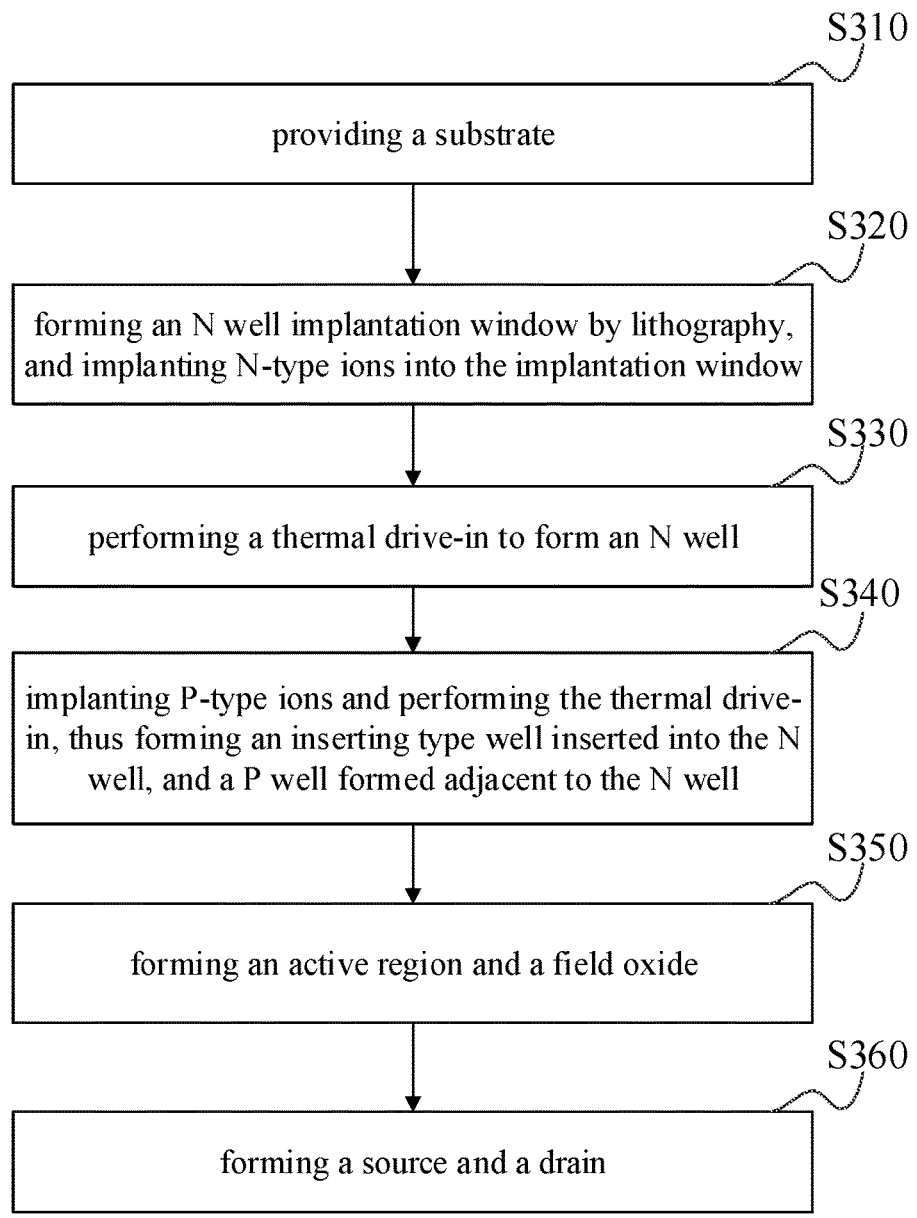
FIG. 3 is a flow chart of a method of manufacturing the laterally diffused metal oxide semiconductor field-effect transistor of FIG. 1 according to the embodiment.

The present disclosure further provides a method of manufacturing a lateral diffusion metal oxide semiconductor field effect transistor having a RESURF structure for forming the LDMOS of FIG. 1. FIG. 3 is a flow chart of a method according to one embodiment including the following steps:

In step S310, a substrate is provided.

In the illustrated embodiment, a P-type doped silicon substrate is provided.

In step S320, an N well implantation window is formed by lithography, and N-type ions are implanted into the substrate through the implantation window.

Since a P well is to be inserted into an N well, a photoresist is formed at a position to be inserted, preserving the position for subsequent formation of an inserting type well. An initial oxidation can be carried out prior to lithography.

In step S330, the N well is formed by a thermal drive-in.

The oxidation of the N well is performed simultaneously with the thermal drive-in, thus an oxide layer is formed on a surface of the N well. The oxide layer can provide a self-aligned implanting structure for a P implantation in step S340, saving a piece of lithography mask. It should be noted that the photoresist is also to be removed prior to performing the next step.

In step S340, P-type ions are implanted and the thermal drive-in is performed, such that an inserting type well inserted into the N well and a P well adjacent to the N well are formed.

The formed inserting type well is sandwiched by the N well, and the P well is formed at an outer side of the N well and is in contact with the N well.

In step S350, an active region and a field oxide are formed.

In the illustrated embodiment, after forming the active region and the field oxide, a gate oxide and a polysilicon gate are generated.

In step S360, a source and a drain are formed.

The drain is formed above the inserting type well and is in contact with the inserting type well.

Figure 4:
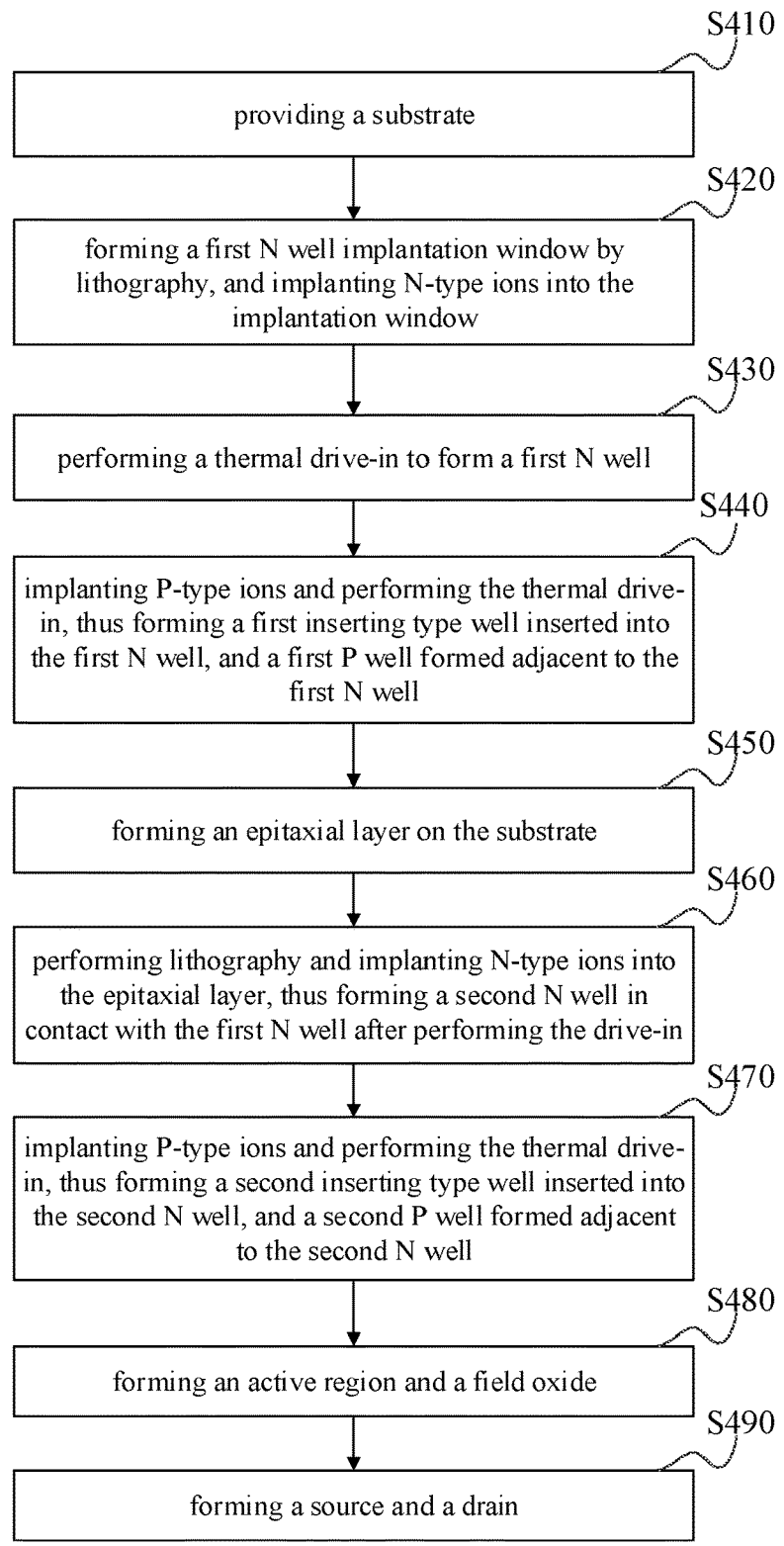
FIG. 4 is a flow chart of a method of manufacturing the laterally diffused metal oxide semiconductor field-effect transistor of FIG. 2 according to the embodiment.

The present disclosure further provides another method of manufacturing a lateral diffusion metal oxide semiconductor field effect transistor having a RESURF structure for forming the LDMOS of FIG. 2. FIG. 4 is a flow chart of a method according to one embodiment including the following steps:

In step S410, a substrate is provided.

In step S420, a first N well implantation window is formed by lithography, and N-type ions are implanted into the substrate through the first N well implantation window.

In step S430, a first N well is formed by a thermal drive-in.

The oxidation of the first N well is performed simultaneously with the thermal drive-in, thus an oxide layer is formed on a surface of the first N well. The photoresist is also to be removed prior to performing the next step.

In step S440, P-type ions are implanted and the thermal drive-in is performed, such that a first inserting type well inserted into the first N well and a first P well adjacent to the first N well are formed.

In step S450, an epitaxial layer is formed on the substrate.

The excess oxide layer is removed before forming the epitaxial layer.

In step S460, lithography is performed and N-type ions are implanted into the epitaxial layer, thus a second N well in contact with the first N well is formed after performing the thermal drive-in.

The photoresist pattern is the same as that in step S420. The implanted N-type ions are drove downwardly by thermal drive-in to be in contact with the first N well. The oxidation of the second N well is performed simultaneously with the thermal drive-in, thus an oxide layer is formed on a surface of the second N well. The oxide layer serves as a self-aligned implanting structure. The photoresist is also to be removed prior to performing the next step.

In step S470, P-type ions are implanted and the thermal drive-in is performed, thus a second inserting type well inserted into the second N well and a second P well formed adjacent to the second N well are formed.

In step S480, an active region and a field oxide are formed.

In the illustrated embodiment, after forming the active region and the field oxide, a gate oxide and a polysilicon gate are generated.

In step S490, a source and a drain are formed.

The drain is formed above the second inserting type well and is in contact with the second inserting type well.

Although the description is illustrated and described herein with reference to certain embodiments, the description is not intended to be limited to the details shown. Modifications may be made in the details within the scope and range equivalents of the claims.

What is claimed is:

1. A laterally diffused metal oxide semiconductor field-effect transistor, comprising:
    a substrate;
    a source;
    a drain;
    a body region; and
    a well region on the substrate,
    wherein the well region comprises:
        an inserting type well having a P-doping type, wherein the inserting type well is disposed below the drain and is in contact with the drain;
        an N well disposed on both sides of the inserting type well; and
        a P well disposed adjacent to the N well and in contact with the N well,
    wherein the source and the body region are disposed in the P well,
        the inserting type well is in direct contact with the substrate,
        the N well is in direct contact with the substrate,
        the P well is in direct contact with the substrate, and
    wherein the well region comprises a first well region on the substrate and a second well region on the first well region; the inserting type well comprises a first inserting type well in the first well region and a second inserting type well in the second well region; the N well comprises a first N well in the first well region and a second N well in the second well region; the P well comprises a first P well in the first well region and a second P well in the second well region.

2. The laterally diffused metal oxide semiconductor field-effect transistor according to claim 1, wherein a doping concentration of the first N well is lower than a doping concentration of the second N well, a doping concentration of the first P well is lower than a doping concentration of the second P well, a doping concentration of the first inserting type well is lower than a doping concentration of the second inserting type well.

3. The laterally diffused metal oxide semiconductor field-effect transistor according to claim 1, further comprising a field oxide region and a polysilicon structure, wherein the field oxide region is disposed on a surface of the N well, and the drain is sandwiched by two of the field oxide region, the polysilicon structure extends from a surface of the field oxide region to a surface of the source.

4. The laterally diffused metal oxide semiconductor field-effect transistor according to claim 3, further comprising a floating layer P well disposed in the N well and below the field oxide region.

5. The laterally diffused metal oxide semiconductor field-effect transistor according to claim 1, a width of the inserting type well is less than or equal to 40% of a width of an active region of the drain.

6. The laterally diffused metal oxide semiconductor field-effect transistor according to claim 5, wherein the width of the inserting type well is 10% to 40% of the width of the active region of the drain.

7. The laterally diffused metal oxide semiconductor field-effect transistor according to claim 1, wherein an active region of the drain has a width of 10 µm, widths of the first inserting type well and the second inserting type well are less than or equal to 2 µm.

8. The laterally diffused metal oxide semiconductor field-effect transistor according to claim 1, wherein a doping concentration of the well region is lower than a doping concentration of the drain.

9. The laterally diffused metal oxide semiconductor field-effect transistor according to claim 1, wherein the substrate is a P-type doped substrate, the drain is an N-type doped drain, the source is an N-type doped source, and the body region is a P-type doped body region.

10. A method of manufacturing a laterally diffused metal oxide semiconductor field-effect transistor, comprising the steps of:
    providing a substrate;
    forming an N well implantation window on the substrate by lithography, and implanting N-type ions into the substrate through the N well implantation window; wherein the N well implantation window is separated by a photoresist covered on the substrate to preserve a position for an inserting type well;
    performing a thermal drive-in to form an N well;
    implanting P-type ions into the substrate and performing the thermal drive-in, thus forming the inserting type well inserted into the N well, and a P well formed adjacent to the N well and in contact with the N well;
    forming an active region and a field oxide; and
    forming a source and a drain;
    wherein the drain is formed above the inserting type well, and is in contact with the inserting type well,
    wherein the inserting type well, the N well, and the P well are formed in direct contact with the substrate, and
    wherein a well region is formed on the substrate, the well region comprises a first well region on the substrate and a second well region on the first well region; the inserting type well comprises a first inserting type well in the first well region and a second inserting type well in the second well region; the N well comprises a first N well in the first well region and a second N well in the second well region; the P well comprises a first P well in the first well region and a second P well in the second well region.

11. The method according to claim 10, wherein the step of performing the thermal drive-in to form the N well comprises forming an oxide layer on a surface of the N well, the oxide layer serves as a self-aligned implanting structure for the step of implanting P-type ions into the substrate.

12. A method of manufacturing a laterally diffused metal oxide semiconductor field-effect transistor, comprising the steps of:
    providing a substrate;
    forming a first N well implantation window on the substrate by lithography, and implanting N-type ions into the substrate through the first N well implantation window; wherein the first N well implantation window is separated by a photoresist covered on the substrate to preserve a position for a first inserting type well;
    performing a thermal drive-in to form a first N well;
    implanting P-type ions into the substrate and performing the thermal drive-in, thus forming the first inserting type well inserted into the first N well, and a first P well formed adjacent to the first N well and in contact with the first N well;
    forming a first epitaxial layer on the substrate;
    performing lithography and implanting N-type ions into the first epitaxial layer, thus forming a second N well in contact with the first N well above the first N well after performing the thermal drive-in;
    implanting P-type ions into the second N well and performing the thermal drive-in, thus forming a second inserting type well inserted into the second N well, and a second P well formed adjacent to the second N well; wherein the second inserting type well is formed above the first inserting type well and is in contact with the first inserting type well, the second P well is formed above the first P well and is in contact with the first P well;
    forming an active region and a field oxide; and
    forming a source and a drain;
    wherein the drain is formed above the second inserting type well, and is in contact with the second inserting type well,
    wherein the first inserting type well, the first N well, and the first P well are formed in direct contact with the substrate, and
    wherein a well region is formed on the substrate, the well region comprises a first well region on the substrate and a second well region on the first well region; the first inserting type well being formed in the first well region and the second inserting type well being formed in the second well region; the first N well being formed in the first well region and the second N well being formed in the second well region; the first P well being formed in the first well region and the second P well being formed in the second well region.

13. The method according to claim 12, wherein the step of performing the thermal drive-in to form the first N well comprises forming an oxide layer on a surface of the first N well, the oxide layer serves as a self-aligned implanting structure for the step of implanting P-type ions into the substrate.

* * * * *